United States Patent [19]

Morris

[11] Patent Number: 5,021,840

[45] Date of Patent: Jun. 4, 1991

[54] SCHOTTKY OR PN DIODE WITH COMPOSITE SIDEWALL

[75] Inventor: Francis J. Morris, Plano, Tex.

[73] Assignee: Texas Instruments Incorporated, Dallas, Tex.

[21] Appl. No.: 449,066

[22] Filed: Dec. 14, 1989

Related U.S. Application Data

[63] Continuation of Ser. No. 294,962, Jan. 6, 1989, abandoned, which is a continuation of Ser. No. 86,464, Aug. 18, 1987, abandoned.

[51] Int. Cl.$^5$ .............................................. H01L 29/48
[52] U.S. Cl. .................................... 357/15; 357/54; 357/13; 357/55
[58] Field of Search ...................... 357/13, 13 R, 13 O, 357/13 V, 13 Z, 13 LM, 13 PT, 54, 54 R, 54 N, 15, 71 S, 71 R, 65, 68, 49, 55, 30 C, 30 P, 15 P, 15 M

[56] References Cited

U.S. PATENT DOCUMENTS

| | | | |
|---|---|---|---|
| 3,745,428 | 7/1973 | Misawa et al. | 357/54 |
| 3,808,470 | 4/1974 | Kniepkamp | 357/15 X |
| 4,272,561 | 6/1981 | Rothman et al. | 357/15 X |
| 4,358,891 | 11/1982 | Roesner | 357/15 X |
| 4,503,600 | 3/1985 | Nii et al. | 357/15 X |
| 4,541,000 | 9/1985 | Colquhoun et al. | 357/15 |
| 4,712,152 | 12/1987 | Iio | 357/13 X |
| 4,752,813 | 6/1988 | Bhatia et al. | 357/15 |
| 4,775,643 | 10/1988 | Wetteroth | 357/13 X |
| 4,825,278 | 4/1989 | Hillenius et al. | 357/54 X |

FOREIGN PATENT DOCUMENTS 0152615 8/1985 European Pat. Off. ............. 357/15
52-55380 5/1977 Japan ................................ 357/54 N

OTHER PUBLICATIONS

Briska et al., "Method of Producing Schottky Contacts", IBM Technical Disclosure Bulletin, vol. 22, No. 11, Apr. 1980, p. 4964.
Ross, "Stable SBD for Nitride-Passivated Processes via Oxide Step Reduction", IBM Technical Disclosure Bulletin, vol. 22, No. 4, Sep. '79, pp. 1403-1404.
Murarka, "Refractory Silicides for Integrated Circuits", J. Vac. Sci. Tecnol., 17 (4), Jul./Aug. 1980, pp. 776-792.

Primary Examiner—William Mintel
Attorney, Agent, or Firm—Rene' E. Grossman; Melvin Sharp

[57] ABSTRACT

Disclosed is a Schottky diode having a platinum silicide Schottky anode layer (25) formed in electrical contact with an underlying silicon semiconductor layer (14). A sidewall oxide (36) is formed around the periphery of the platinum silicide area (25) to prevent etching processes from exposing a portion of the underlying silicon semiconductor layer (14). A titanium tungsten diffusion barrier layer (26) and an aluminum composition layer (28) are formed thereover to provide electrical contact to the Schottky diode.

29 Claims, 1 Drawing Sheet

SCHOTTKY OR PN DIODE WITH COMPOSITE SIDEWALL

This application is a continuation of application Ser. No. 07/294,962, filed Jan. 18, 1989, which is a continuation of Ser. No. 07/086,464, filed on Aug. 18, 1987, which are both now abandoned.

RELATED APPLICATIONS

"Method for Fabricating a Buried Schottky Logic Array and Apparatus Produced Thereby", by Francis J. Morris and Stephen A. Evans, Ser. No. 787,865, filed Oct. 16, 1985, Attorneys' Docket No. TI-9274, and incorporated herein by reference.

TECHNICAL FIELD OF THE INVENTION

The present invention relates in general to semiconductor devices, and more particularly relates to Schottky barrier diode apparatus and methods of fabrication thereof.

BACKGROUND OF THE INVENTION

Diodes provide a rectifying function which is necessary to the operation of many analog and digital circuits. There are many types of diodes which are classified primarily according to the special functions or characteristics thereof. For example, diodes can be fabricated to enhance such characteristics as power, speed, size, frequency response, forward and reverse breakdown voltages, etc.

A Schottky barrier diode is a specialized type of diode which is characterized by a low forward threshold voltage and exhibits a high switching speed. These characteristics are achieved in the formation of the diode by placing a Schottky barrier metal in intimate contact with a lightly doped semiconductor material. Because of the low work function at the metal-semiconductor interface, the diode is characterized by a lower forward breakdown voltage than otherwise obtained by a PN junction. This structure is also a majority carrier device, thereby substantially reducing minority carrier storage effects, and permitting high-speed switching thereof.

Schottky diodes can be employed as high speed rectifiers in many circuit applications, or can be used as clamping devices in conjunction with transistors to improve the switching speed thereof. When so utilized, a Schottky clamped transistor is formed. U.S. Pat. No. 3,909,837, by Kronlage, is exemplary of the fabrication of a Schottky diode formed across the base-collector junction of a bipolar transistor to increase the switching capabilities thereof.

In fabricating a Schottky diode according to conventional silicon semiconductor planar processes, certain artifacts can appear which degrade the quality of the diode performance. For example, when utilizing a Schottky barrier metal, such as platinum, as the anode material, and when utilizing aluminum as a terminal contact material overlying the Schottky anode material, a conductive diffusion barrier substance must be deposited therebetween to prevent the aluminum from penetrating or diffusing into the underlying platinum and thereby degrading the performance of the device. While the diffusion barrier material is effective to circumvent the noted problem, other anomalies may arise. As an example, during cleaning or deglazing of the Schottky anode metal surface, the insulation located peripheral to the anode metal area may also be removed, thereby exposing the underlying semiconductor material. Thus, when the conductive diffusion barrier material is deposited over the wafer and contacts the semiconductor material around the periphery of the Schottky anode metal, an additional lower anode metal-semiconductor secondary diode may be formed in parallel with the Schottky diode. A sub-optimal device is thereby formed, as the lower voltage diode short-circuits the higher voltage Schottky device.

From the foregoing, it can be seen that a need exists for a diode fabrication process which prevents the formation of the noted secondary diodes, and thereby provides improved performance and reliability of the Schottky diode. More particularly, a need exists for a Schottky diode process which prevents the undesired contact of diffusion barrier metal materials with the semiconductor material, and which encompasses no additional fabrication masks or masking steps.

SUMMARY OF THE INVENTION

In accordance with the present invention, the disclosed Schottky diode, and method of fabrication thereof, substantially reduces or eliminates the disadvantages and shortcomings associated with the prior art techniques. According to the invention, the Schottky diode is fabricated by forming an opening in a surface insulation layer to an underlying semiconductor material. A Schottky anode metal is deposited on the semiconductor material, covering the insulation layer and contacting the semiconductor material area defined by the opening. The Schottky anode metal is then reacted in an ambient to form a silicide with that portion of the anode metal contacting the semiconductor material. The nonreacted anode metal is removed.

Next, a sidewall insulation is formed on the sidewall of the opening in the surface insulation to protect the peripheral area of the Schottky anode metal. The sidewall insulation comprises silicon oxide deposited as a conformal layer, and anisotropically etched to remove a uniform thickness thereof. The sidewall oxide, being thicker than that deposited on lateral surfaces of the Wafer, remains in the peripheral area where the Schottky anode metal joins the sidewall of the surface insulation opening. With this structure, subsequent etches or deglazing steps cannot form paths around the periphery of the Sckottky anode metal to the underlying semiconductor material. Subsequent layers of metals, such as the conductive interface material and the overlying terminal contact material cannot establish contact to the underlying semiconductor material and thereby form a secondary diode.

In accordance with another embodiment of the invention, a PN junction diode can be constructed using the sidewall oxide to prevent secondary Schottky diodes from being inadvertently formed around the periphery of the semiconductor region forming one of the junction regions.

BRIEF DESCRIPTION OF THE DRAWINGS

Further features and advantages will be become more apparent from the following and more particular description of the preferred embodiment of the invention, as illustrated in the accompanying drawings in which like reference characters generally refer to the same regions or areas throughout the views, and in which.

DETAILED DESCRIPTION OF THE INVENTION

Figure 1:
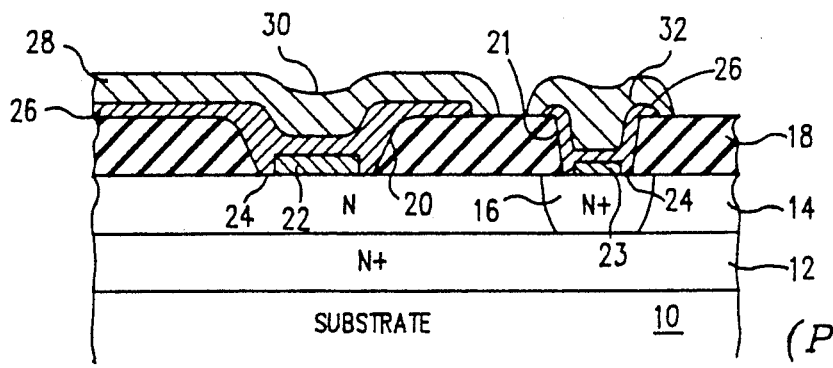
FIG. 1 is a sectional view of a semiconductor diode structure, illustrating the formation of a secondary diode encircling the anode metal area forming the Schottky diode.
Figure 2:
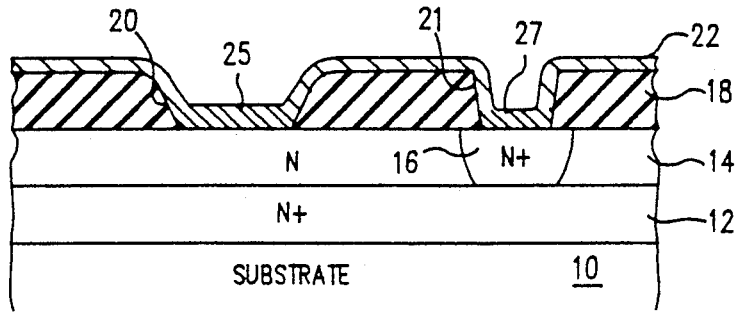
FIGS. 2-5 illustrate sectional views of a semiconductor Schottky diode and a PN junction diode of the invention, taken during sequential processing steps in the fabrication thereof.

FIG. 1 illustrates a Schottky diode structure constructed in accordance with conventional techniques. Such Schottky diodes include a semiconductor substrate 10 on which is formed a heavily doped semiconductor layer 12. The heavily doped layer 12 is formed with an N-type impurity. The N+ layer 12 can be formed by diffusion, epitaxial or other silicon fabrication processes. Formed on the heavily doped layer 12 is more lightly doped silicon semiconductor layer 14. Formed during the fabrication of other semiconductor devices on the substrate 10 is a heavily doped N+ region 16 formed through the lightly doped layer 14 in electrical contact with the N+ layer 12. The N+ region 16 provides a low resistance contact area to the cathode of the Schottky diode. The N+ region 16 is formed prior to the Schottky diode metal processing.

In forming the Schottky diode, a layer of insulating material, such as thermal silicon oxide 18, is deposited or thermally grown on the silicon semiconductor layer 14, and patterned to define an opening 20 for forming the anode of the Schottky diode. During such processing, an opening 21 is also formed to define an area in the silicon semiconductor layer 14 for forming the N+ diode cathode. While the silicon oxide 18 is technically a dioxide, such material is referred to in the art as an oxide. A Schottky anode metal layer 22 of a refractory type metal, or platinum, is deposited over the wafer, making intimate contact with the underlying silicon semiconductor layer 14. The metal layer defines an area 23 which also makes intimate contact with the silicon layer 14 in the diode cathode region. Platinum can be employed as the Schottky anode metal 22. Other Schottky anode metals such as tungsten, cobalt or gold are well suited for use in constructing Schottky diodes.

The wafer is then subjected to an elevated temperature in a nitrogen or nitrogen-oxygen ambient, whereupon the Schottky anode metal 22 reacts with the underlying silicon semiconductor material 14 and forms a platinum silicide. Regions or areas of the platinum 22 not in contact with silicon, such as that which overlies the thermal silicon oxide 18, are not transformed into a silicide. Since the silicon semiconductor layer 14 is lightly doped, a Schottky contact, rather than an ohmic contact, is formed at the interface between Schottky anode metal 22 and the silicon semiconductor layer 14. The high doping concentration of the N+ cathode region 16 assures that the platinum silicide area 23 forms an ohmic contact with the N+ cathode region 16. The wafer is then placed in an aqua regia solution for removing the unreacted platinum which has not been transformed into a silicide. The reacted platinum silicide material 22, which also retains a high barrier characteristic, remains on the wafer in intimate contact with the silicon semiconductor layer 14. The conductive platinum silicide Schottky anode material is depicted as reference character 22 in FIG. 1. The platinum silicide associated with the diode cathode is shown as numeral 23.

Next, the wafer is subjected to a sputter etch, or other conventional etch, to remove any oxide residue which may have formed as a result of the silicide forming process. A low resistance contact to the exposed top surface of the silicide layer 22 and area 23 is thus assured. In the etch or deglazing step, a portion of the thermal silicon oxide layer 18 is removed, and often in the areas 24 where the thermal silicon oxide 18 is thin. Such areas are generally in the peripheral area of the platinum silicide material 22 and cathode area 23. While the area 24 can comprise an annular ring encircling the platinum silicide material 22, in many situations such area is not continuous, but may be in the nature of spikes or holes formed through a very thin thermal silicon oxide residue which was initially an edge of the silicon oxide layer 18.

Next, a low barrier interface material, such as titanium tungsten (Ti-W) 26 is deposited over the wafer, making an excellent electrical contact with the platinum silicide material 22 and cathode area 23. The low barrier interface material 26 often makes an undesirable electrical contact to the underlying silicon semiconductor layer 14 at peripheral area 24 of the anode, thereby forming a low barrier secondary diode. The low barrier diode is in parallel with the Schottky diode formed by the platinum silicide material 22 and the underlying silicon semiconductor layer 14. Because the electrical barrier height of the titanium tungsten layer 26 is lower than that of the platinum silicide material 22, the secondary diode effectively provides an electrical short circuit around the Schottky diode. The performance of the Schottky diode is thereby degraded.

In order to provide a terminal contact to the anode of the Schottky diode, a layer of aluminum 28 is deposited over the surface of the wafer, making electrical contact with the titanium tungsten diffusion barrier layer 26, as well as to the titanium tungsten 26 in the cathode contact region 16. The titanium tungsten layer functions as an interface or barrier for separating the aluminum 28 from the platinum silicide material 22, but provides electrical continuity therebetween. As a result, the aluminum material 28 cannot migrate, diffuse or otherwise degrade the platinum silicide material 22. The aluminum layer 28 is then patterned to form the Schottky diode anode contact 30 separate from the cathode contact 32. When embodied in an integrated circuit, external electrical connections can be formed in a conventional manner with metal contacts 30 and 32. The Schottky diode can also be fabricated as a discrete device by forming a metal cathode contact to the backside of the heavily doped layer 12, and eliminate the heavily doped region 16.

FIGS. 2-5 illustrate a Schottky diode constructed in accordance with the present invention. The semiconductor wafer is processed in accordance with the foregoing to provide the heavily doped semiconductor layer 12, the lightly doped silicon semiconductor layer 14, the cathode semiconductor contact region 16 and the thermal silicon oxide layer 18 having openings 20 and 21 defined therein for locating respectively the Schottky diode anode and cathode. A layer of platinum 22 is deposited thereover, and subjected to the high temperature nitrogen ambient to form a platinum silicide (PtSi) layers 25 and 27 in the openings 20 and 21 respectively, each silicide layer contacting the underlying silicon semiconductor layer 14. Refractory or barrier metals other than platinum can be used. The wafer is then placed in an aqua regia solution to remove the unreacted platinum material 22 which has not been transformed into the silicide 23.

Figure 3:
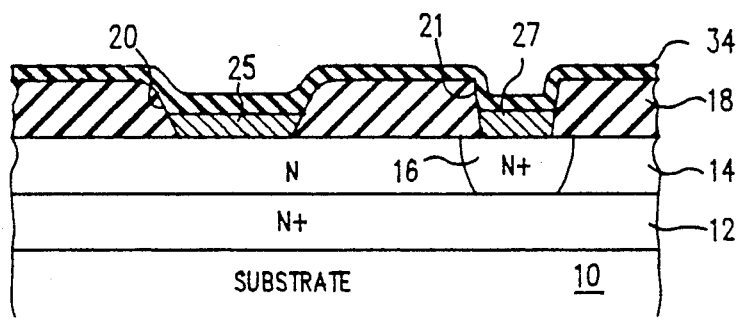

As illustrated in FIG. 3, a conformal layer 34 of silicon oxide is deposited over the surface of the wafer to a depth of about 3,000 angstroms. The conformal silicon oxide 34 may be deposited by conventional plasma techniques. Next, the wafer is subjected to a blanket anisotropic etch for removing a layer of the conformal silicon oxide 34 equal in depth to that which was originally deposited. A dry etch of the plasma type may be effective to anisotropically etch the conformal silicon oxide 34 in a vertical direction.

Figure 4:
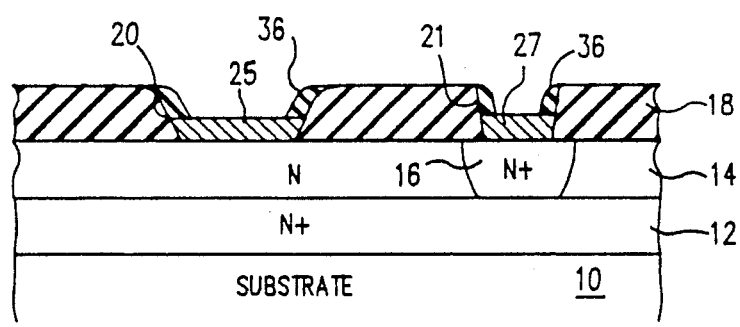

FIG. 4 illustrates the wafer after the noted anisotropic etch. The sidewalls 20 and 21 defining the opening in the thick thermal silicon oxide layer 18 have remaining thereon a sidewall oxide 36. While FIG. 4 illustrates the wafer in cross section, it should be understood that the sidewall oxide 36 is formed on all vertical side surfaces of the openings 20 and 21. Importantly, the sidewall oxide 36 protects the peripheral edges of the platinum silicide 25 and 27, thereby preventing the erosion of edges of the thermal silicon oxide layer 18 during subsequent mild etching or cleaning operations. It is also significant to note that the anisotropic plasma etch is dry in nature, and thus is not detrimental to the platinum silicide areas 25 and 27. The formation of sidewall oxides in silicon semiconductor fabrication processes is described in detail in U.S. Pat. Nos. 4,356,040 and 4,356,626, the subject matter of which is incorporated herein by reference.

In accordance with an important feature of the invention, no additional photolithography steps or masks are necessary in order to form the sidewall oxide insulation 36. The wafer is simply coated with a conformal layer of the silicon oxide 34, and then blanket etched with an anisotropic etch process. In all other lateral areas of the wafer, the conformal oxide 34 is uniformly removed and therefore does not interfere with subsequent processing of the wafer. Other sidewall insulating materials, such as silicon nitride (Sihd 3N4), can be employed for forming the sidewall insulator 36. Of course, the etching process would be adjusted to provide anisotropic etching of the silicon nitride.

The fabrication of the Schottky diode of the invention proceeds in a conventional manner by cleaning the top surface of the wafer by in situ sputter etching thereof. The sputter etching, or other type of etch, cleans the top surface of the platinum silicide 25 and 27 to provide a good electrical contact with a conductive interface material to be deposited thereover. In keeping with the invention, the etch process can be carried out without great concern that secondary diodes will be formed around the peripheral area of the platinum silicide 25 and 27.

As noted above, the formation of the cathode contact area 16 can be accomplished employing conventional techniques for defining the cathode area, implanting or diffusing an N-type impurity into an opening to form the heavily doped region 16. The N-type heavily doped region 16 extends downwardly in electrical contact with the N+ layer 12. The titanium tungsten composition diffusion barrier layer 26 is then formed in electrical contact over the platinum silicide 27 by the same step as that described in connection with the anode structure of the Schottky diode.

Formed over the titanium tungsten diffusion barrier layer 26 is a layer of an aluminum-copper composition 28 which is in electrical contact with the underlying titanium tungsten diffusion barrier layer 26. In the preferred form of the invention, an aluminum base having about two percent copper is utilized in forming layer 28. The titanium tungsten layer 26 functions as a diffusion barrier layer for preventing migration or penetration of the aluminum 28 into the underlying platinum silicide 25 of the diode anode. Lastly, electrical contact can be made to the Schottky diode of the invention by patterning the aluminum composition layer 28 to form a metal anode contact 38 and a metal cathode contact 40.

The foregoing technique can also be utilized for preventing the formation of secondary Schottky diodes during the fabrication of junction diodes which are formed on the wafer with the Schottky diode of the invention. For example, in those cases where a junction type of diode is to be formed utilizing a P-type semiconductor region formed within the N-type layer 14, rather than the Schottky anode silicide area 25, the sidewall oxide is effective to prevent exposure of the underlying N layer 14 and thus the possible contact thereto of metal layers which can form undesirable secondary Schottky diodes.

Figure 5:
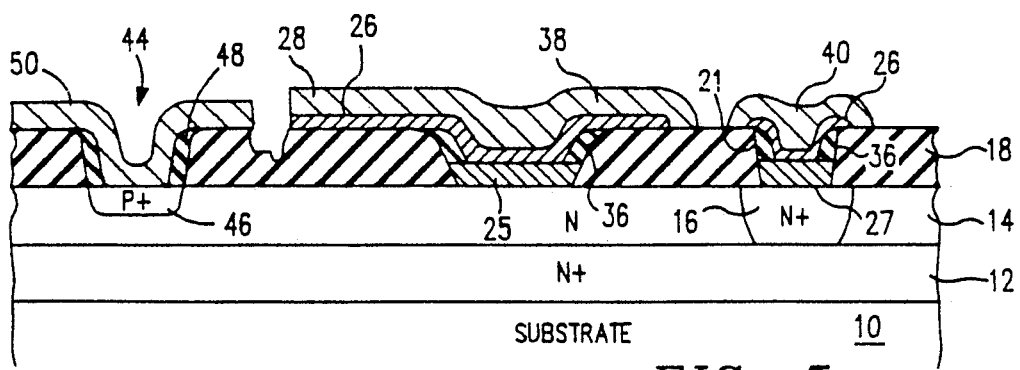

More particularly, FIG. 5 illustrates a PN junction diode 44 constructed in accordance with the invention. The junction diode 44 is formed by patterning the thick silicon oxide layer 18 to define the location of the diode. A P-type implant is then conducted to form a self-aligned shallow heavily doped P+ region 46 within the lightly doped N layer 14. Boron can be used as the P-type impurity, at an energy and dosage of 30–100keV, $10^{14}$ atoms/cm$^2$. For small area diodes, a 2000–3000 angstrom depth, or less, is desirable. The PN junction is preferably maintained shallow and of a small width, and thus the P+ region 46 is annealed at a low temperature and in a short time period sufficient to activate the impurities. In this manner, the P+ region 46 does not substantially diffuse laterally under the edges of the thick oxide opening. Smaller area junction diodes are thereby made possible.

A conformal silicon oxide layer is deposited over the wafer and anisotropically etched by the same process described above, to form the sidewall oxide protective layer 48. The wafer is cleaned by a wet etch which, according to the invention, does not remove the thick oxide 18 in the opening and thereby expose portions of the N layer 14 located around the peripheral edge of the P+ region 46. As with the Schottky diode embodiment, the sidewall oxide 48 protects the thick field oxide 18 from the etching process. The sidewall oxide 48 thus protects any subsequent metallization from contacting the N layer 14. The cathode of the diode 44 can be formed by the same technique utilized in forming the Schottky diode cathode.

According to conventional diode fabrication techniques not employing a rapid thermal anneal step, the P+ region 46 diffuses somewhat laterally under the thick oxide 18 and thus removal of a small portion of the thick oxide in the opened area, by cleaning or etching steps, does not expose the underlying N-type layer 14. Hence, the lateral diffusion of the P+ impurities generally prevents the formation of metal short circuits to the N layer 14. However, such lateral diffusion requires extra wafer area which is counterproductive to the high density requirements of current MOS/CMOS processing techniques.

Returning to FIG. 5, a metal conductor layer 50 is deposited over the wafer and patterned to form a conductor to the junction diode 44. The metal layer 50 forms an ohmic contact with the P+ region 46. The junction diode 44 can also be formed according to the Schottky diode techniques described above, in that the metal layer 50 can be of the type which can be reacted to form a silicide. In other words, a platinum metal, for example, can first be deposited on the wafer for making intimate contact with the P+ region 46. The platinum is then reacted to form a silicide, and followed by a deposition of titanium-tungsten and aluminum thereover. In the alternative, the top layer of conductive material can be a metal system such as silicon doped with aluminum, as currently employed in the fabrication of high density MOS/CMOS circuits.

From the foregoing, a Schottky diode and junction diode, and method of fabrication thereof, are disclosed for providing a more reliable device having high performance characteristics. An important technical advantage of the Schottky diode structure of the invention is that the peripheral edge of the high barrier material forming the Schottky diode is protected so that secondary or sub-optimal diodes cannot be formed. In like manner, secondary Schottky diodes are prevented from forming in the peripheral areas of shallow PN junction type diodes. An additional technical advantage presented by the invention is that no additional masking steps are required to provide the protective sidewall oxide structures, thereby providing a significant advantage without requiring additional and costly fabrication steps. Yet another technical advantage presented by the invention is that by anisotropically etching a conformal layer of oxide to form the protective sidewall oxide, the topographical nature of the wafer is not substantially altered, thereby allowing subsequent layers of material to be deposited on the wafer, without concern of undue stress due to an uneven surface topography. A subsidiary technical advantage of the invention is that highly specialized silicon processing techniques are not required, and thus the Schottky diode of the invention can be formed in conjunction with transistors to provide Schottky clamped devices.

While the preferred embodiment of the invention has been disclosed with reference to specific fabrication methods and diode structures, it is to be understood that many changes in detail may be made as a matter of engineering choices without departing from the spirit and scope of the invention, as defined by the appended claims.

What is claimed is:

1. A diode disposed on an integrated circuit structure comprising:
   (a) a first electrically conductive region of doped semiconductor material of a first conductivity type;
   (b) a second electrically conductive region contacting said first region, said first and second regions exhibiting a diode barrier characteristic about the interface of said first and second regions, said second region including an upper surface and a peripheral boundary adjoining said upper surface;
   (c) a first insulative layer disposed over said first region and including an opening positioned about said second region, said insulative layer including a side surface portion along the periphery of the opening and a portion overlying portions of said first region, said side portion substantially aligned with the peripheral boundary of said second region;
   (d) an electrical contact to the upper surface of said second region; and
   (e) a sidewall insulative layer, physically distinct from said first insulative layer, preventing formation of a diode interface between said electrical contact and said first conductive region, said sidewall layer overlying and contacting the surface of said second region remote from said first electrically conductive region, said sidewall layer also abutting the side surface portion of said first insulative layer.

2. A diode formed on an integrated circuit structure comprising:
   (a) a first electrically conductive region formed of doped semiconductor material of a first conductivity type;
   (b) a second electrically conductive region contacting said first region, said first and second regions exhibiting a diode barrier characteristic about the interface of said first and second regions, said second region including an upper surface and a peripheral boundary adjoining the upper surface;
   (c) a first insulative layer formed over said first region and including an opening positioned about said second region, said insulative layer including a side surface portion along the periphery of the opening and a portion overlying portions of said first region, said side portion substantially aligned with the peripheral boundary of said second region;
   (d) an electrical contact to the upper surface of said second region; and
   (e) a sidewall insulative layer, distinct from said first insulative layer, for preventing formation of a diode interface between said electrical contact and said first conductive region, said sidewall layer overlying and contacting the surface of said second region remote from said first electrically conductive region, said sidewall layer also abutting the side surface portion of said first insulative layer;
   wherein said second conductive region is a metal-containing Schottky barrier layer including a lower surface physically contacting the exposed portion of said semiconductor layer; and
   said electrical contact provides an anode connection.

3. The diode of claim 2 further comprising a cathode contact extending through a second opening in said first insulative layer to said first region.

4. The diode of claim 2 wherein said first insulative layer comprises chiefly silicon dioxide.

5. The diode of claim 2 wherein said sidewall insulative layer comprises chiefly silicon dioxide.

6. The diode of claim 2 wherein said sidewall insulative layer comprises chiefly silicon nitride.

7. The diode of claim 3 wherein said anode and cathode electrical contacts each comprise titanium tungsten.

8. The diode of claim 2 further comprising an aluminum conductor formed in electrical contact with said anode electrical contact.

9. The diode of claim 2 wherein said Schottky barrier layer is a silicide self-aligned to the opening in said first insulative layer.

10. The diode of claim 2 wherein the surface area of that portion of the lower surface of said Schottky barrier layer which physically contacts said first region is no greater than the surface area of said first conductive region opened through said first insulative layer.

11. The diode of claim 2 wherein the metal containing layer comprises platinum silicide.

12. The diode of claim 2 wherein the Schottky barrier layer is formed entirely within the opening in said first insulative layer.

13. The diode of claim 3 wherein said first region is of n-type conductivity.

14. The diode of claim 3 wherein said first insulative layer is a thermal silicon oxide and said sidewall insulative layer is a deposited silicon oxide.

15. The diode of claim 3 wherein said second conductive region comprises semiconductor material of a second conductivity type positioned between said first region and the opening in said first insulative layer.

16. The diode of claim 12 wherein said first region comprises a net n-dopant concentration.

17. The diode of claim 3 wherein said second conductive region comprises semiconductive material of a second conductivity type.

18. The diode of claim 17 wherein said second conductive region is characterized by ion implantation aligned with the opening in said first insulative layer.

19. The diode of claim 17 wherein said first insulative layer comprises chiefly silicon dioxide.

20. The diode of claim 18 wherein said sidewall insulative layer is deposited silicon dioxide.

21. The diode of claim 1 wherein said first insulative layer and said sidewall insulative layer are of the same chemical composition.

22. The diode of claim 21 wherein said first insulative layer and said sidewall insulative layer comprise silicon dioxide.

23. The diode of claim 1 wherein said first and second conductive regions are on a single semiconductor layer and characterized by opposite net dopant concentrations.

24. The diode of claim 1 wherein said first and second regions form a p-n junction diode, said first region self-aligned to the opening in said first insulative layer.

25. The diode of claim 17 wherein said second conductive region has a thickness of 3000 Angstroms or less.

26. A diode comprising:
 a heavily doped semiconductor layer of a first conductivity type;
 a semiconductor layer of the first conductivity type, lightly doped relative to said heavily doped layer, disposed over said heavily doped layer;
 a first insulative layer disposed over said lightly doped layer and having first and second openings to said lightly doped layer;
 a cathode semiconductor contact region formed in said lightly doped layer and aligned with said second opening;
 a silicide layer self-aligned with each said opening and contacting said lightly doped layer; and
 a sidewall insulative layer distinct from said first insulative layer, overlying said silicide layer in each said opening and aligned with peripheral portions of said first insulative layer along each said opening.

27. The diode of claim 26 wherein the first insulative layer is a thermal oxide and the sidewall layer is a deposited oxide.

28. A p-n junction diode comprising:
 a heavily doped semiconductor layer of a first conductivity type;
 a semiconductor layer of the first conductivity type, lightly doped relative to said heavily doped layer, disposed over said heavily doped layer;
 a first insulative layer disposed over said lightly doped layer and having first and second openings to said lightly doped layer;
 a cathode semiconductor contact region disposed in said lightly doped layer and aligned with said second opening;
 a region of a second conductivity type disposed in said lightly doped layer and in self-alignment about said first opening; and
 a sidewall insulative layer physically distinct from said first insulative layer, overlying both the region of said second conductivity type and said first insulative layer along each said opening, said sidewall layer self-aligned with said first opening.

29. The diode of claim 19 wherein said sidewall insulative layer comprises silicon nitride.

* * * * *